United States Patent
Huang et al.

(10) Patent No.: US 12,163,916 B2
(45) Date of Patent: Dec. 10, 2024

(54) BioFET SYSTEM

(71) Applicant: Taiwan Semiconductor Manufacturing Company, Ltd., Hsinchu (TW)

(72) Inventors: Yu-Jie Huang, Kaohsiung (TW); Jui-Cheng Huang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/403,362

(22) Filed: Jan. 3, 2024

(65) Prior Publication Data

US 2024/0133841 A1  Apr. 25, 2024

Related U.S. Application Data

(63) Continuation of application No. 18/176,725, filed on Mar. 1, 2023, now Pat. No. 11,892,427, which is a continuation of application No. 16/869,753, filed on May 8, 2020, now Pat. No. 11,614,421.

(51) Int. Cl.
  *G01N 27/414* (2006.01)
  *H03K 19/185* (2006.01)

(52) U.S. Cl.
  CPC ........ *G01N 27/4145* (2013.01); *H03K 19/185* (2013.01)

(58) Field of Classification Search
  CPC .................................................. G01N 27/4145
  USPC ....................................................... 257/253
  See application file for complete search history.

(56) References Cited

U.S. PATENT DOCUMENTS

| | | | |
|---|---|---|---|
| 4,980,686 A * | 12/1990 | Gulczynski | G11C 27/026 341/122 |
| 5,805,020 A * | 9/1998 | Danz | H03F 1/305 330/10 |
| 10,533,966 B2 | 1/2020 | Huang et al. | |
| 11,614,421 B2 | 3/2023 | Huang et al. | |
| 11,892,427 B2 | 2/2024 | Huang et al. | |
| 2009/0303172 A1 | 12/2009 | Park et al. | |
| 2011/0062972 A1 | 3/2011 | Je et al. | |
| 2015/0308974 A1 | 10/2015 | Huang et al. | |
| 2016/0238553 A1 | 8/2016 | Shachar | |
| 2017/0242000 A1 | 8/2017 | Fahmy et al. | |
| 2019/0033251 A1 * | 1/2019 | Huang | G01N 27/4145 |
| 2019/0113476 A1 * | 4/2019 | Coln | G01N 27/3278 |

(Continued)

FOREIGN PATENT DOCUMENTS

| | | |
|---|---|---|
| CN | 104677967 A | 6/2015 |
| CN | 110163015 A | 8/2019 |
| CN | 110535345 A | 12/2019 |

(Continued)

*Primary Examiner* — Tomi Skibinski
(74) *Attorney, Agent, or Firm* — Merchant & Gould P.C.

(57) ABSTRACT

A bio-field effect transistor (bioFET) system includes a bioFET configured to receive to a first voltage signal and output a current signal, where the current signal varies exponentially with respect to the first voltage signal. A logarithmic current-to-time converter is connected to the bioFET and is configured to receive the current signal and convert the current signal to a time domain signal. The time domain signal varies logarithmically with respect to the current signal, such that the time domain signal varies linearly with respect to the first voltage signal.

20 Claims, 7 Drawing Sheets

(56) References Cited

U.S. PATENT DOCUMENTS

2020/0132621 A1    4/2020    Huang et al.

FOREIGN PATENT DOCUMENTS

| DE | 102017123949 A1 | 1/2019 |
| JP | 2017-6132 A | 1/2017 |
| KR | 10-2009-0128255 A | 12/2009 |
| WO | 2012/056247 A1 | 5/2012 |

* cited by examiner

BioFET SYSTEM

CROSS-REFERENCE

This application is a continuation of U.S. patent application Ser. No. 18/176,725, filed Mar. 1, 2023, which is a continuation of Ser. No. 16/869,753, filed May 8, 2020, now U.S. Pat. No. 11,614,421 which are hereby incorporated in their entirety by reference.

BACKGROUND

Biosensors are devices for sensing and detecting biomolecules and operate on the basis of electronic, electrochemical, optical, and mechanical detection principles. Biosensors that include transistors are sensors that electrically sense charges, photons, and mechanical properties of bio-entities or biomolecules. The detection can be performed by detecting the bio-entities or biomolecules themselves, or through interaction and reaction between specified reactants and bio-entities/biomolecules. Such biosensors can be manufactured using semiconductor processes, can quickly convert electric signals, and can be easily applied to integrated circuits (ICs) and microelectromechanical systems (MEMS).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
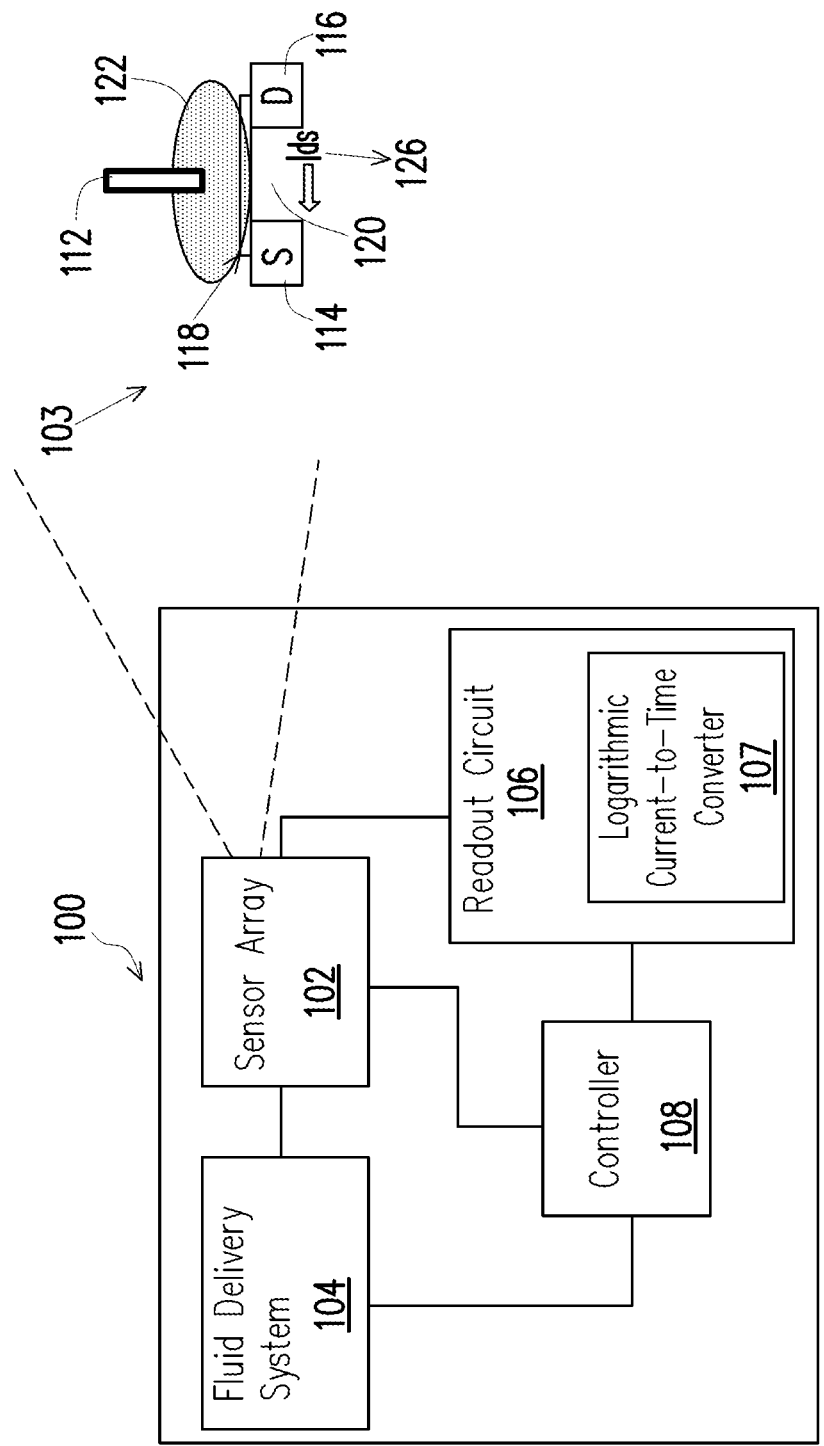
FIG. 1 is a block diagram of an example biosensor system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, the term "bioFET" as used herein refers to a FET that includes a layer of immobilized capture reagents that act as surface receptors to detect the presence of a target analyte of biological origin. A bioFET is a field-effect sensor with a semiconductor transducer, according to some embodiments. One advantage of bioFETs is the prospect of label-free operation. Specifically, bioFETs enable the avoidance of costly and time-consuming labeling operations such as the labeling of an analyte with, for instance, fluorescent or radioactive probes. The analytes for detection by a bioFET will normally be of biological origin, such as—without limitation—proteins, carbohydrates, lipids, tissue fragments, or portions thereof. A BioFET can be part of a broader genus of FET sensors that may also detect any chemical compound (known in the art as a "ChemFET") or any other element, including ions such as protons or metallic ions (known in the art as an "ISFET"). This disclosure applies to all types of FET-based sensors ("FET sensor").

"Capture reagent," as used herein, is a molecule or compound capable of binding the target analyte or target reagent, which can be directly or indirectly attached to a substantially solid material. The capture agent can be a chemical, and specifically any substance for which there exists a naturally occurring target analyte (e.g., an antibody, polypeptide, DNA, RNA, cell, virus, etc.) or for which a target analyte can be prepared, and the capture reagent can bind to one or more target analytes in an assay.

"Target analyte," as used herein, is the substance to be detected in the test sample using the present disclosure. The target analyte can be a chemical, and specifically any substance for which there exists a naturally occurring capture reagent (e.g., an antibody, polypeptide, DNA, RNA, cell, virus, etc.) or for which a capture reagent can be prepared, and the target analyte can bind to one or more capture reagents in an assay. "Target analyte" also includes any antigenic substances, antibodies, or combinations thereof. The target analyte can include a protein, a peptide, an amino acid, a carbohydrate, a hormone, a steroid, a vitamin, a drug including those administered for therapeutic purposes as well as those administered for illicit purposes, a bacterium, a virus, and metabolites of or antibodies to any of the above substances.

"Test sample," as used herein, means the composition, solution, substance, gas, or liquid containing the target analyte to be detected and assayed using the present disclosure. The test sample can contain other components besides the target analyte, can have the physical attributes of a liquid, or a gas, and can be of any size or volume, including for example, a moving stream of liquid or gas. The test sample can contain any substances other than the target analyte as long as the other substances do not interfere with the binding of the target analyte with the capture reagent or the specific binding of the first binding member to the second binding member. Examples of test samples include, but are not limited to, naturally-occurring and non-naturally occurring samples or combinations thereof. Naturally-occurring test samples can be synthetic or synthesized. Naturally-occurring test samples include body or bodily fluids isolated from anywhere in or on the body of a subject, including, but not limited to, blood, plasma, serum, urine, saliva or sputum, spinal fluid, cerebrospinal fluid, pleural fluid, nipple aspirates, lymph fluid, fluid of the respiratory, intestinal, and genitourinary tracts, tear fluid, saliva, breast milk, fluid from the lymphatic system, semen, cerebrospinal fluid, intra-organ system fluid, ascitic fluid, tumor cyst fluid, amniotic fluid and combinations thereof, and environmental samples such as ground water or waste water, soil extracts, air, and pesticide residues or food-related samples.

Detected substances can include, for example, nucleic acids (including DNA and RNA), hormones, different pathogens (including a biological agent that causes disease or illness to its host, such as a virus (e.g., H7N9 or HIV), a protozoan (e.g., *Plasmodium*-causing malaria), or a bacteria (e.g., *E. coli* or *Mycobacterium tuberculosis*)), proteins, antibodies, various drugs or therapeutics or other chemical or biological substances, including hydrogen or other ions, non-ionic molecules or compounds, polysaccharides, small chemical compounds such as chemical combinatorial library members, and the like. Detected or determined parameters may include, but are not limited to, pH changes, lactose changes, changing concentration, particles per unit time where a fluid flows over the device for a period of time to detect particles (e.g., particles that are sparse), and other parameters.

As used herein, the term "immobilized," when used with respect to, for example, a capture reagent, includes substantially attaching the capture reagent at a molecular level to a surface. For example, a capture reagent may be immobilized to a surface of the substrate material using adsorption techniques including non-covalent interactions (e.g., electrostatic forces, van der Waals, and dehydration of hydrophobic interfaces) and covalent binding techniques where functional groups or linkers facilitate attaching the capture reagent to the surface. Immobilizing a capture reagent to a surface of a substrate material may be based on the properties of the substrate surface, the medium carrying the capture reagent, and the properties of the capture reagent. In some cases, a substrate surface may be first modified to have functional groups bound to the surface. The functional groups may then bind to biomolecules or biological or chemical substances to immobilize them thereon.

Some BioFETs are operated in a subthreshold region, i.e., where the gate-to-source voltage is below the threshold voltage of the device. BioFETs operated in the subthreshold region have advantages of relatively large transconductance change signal, lower power consumption and time drift. However, the output signals of bioFETs are nonlinear. Readout systems based on linear transimpedance amplifier (TIA) may be employed. However, output signals of linear TIA-based readout systems are still nonlinear, resulting in narrow input dynamic range. Digital compensation methods may be employed. However, digital compensation methods cannot solve the issue of narrow input dynamic ranges and need more complex design and chip area.

In accordance with some disclosed examples, exponential current signals output by bioFETs operated in subthreshold regions are converted to linear time domain signals by logarithmic current-to-time converters. Specifically, the logarithmic current-to-time converter may convert an exponential current signal to a linear time domain signal rather than a nonlinear voltage signal. The method is an analog readout method to deal with the nonlinear behavior of bioFET output signals in the subthreshold region and convert bioFET output signals to linear signals.

FIG. 1 is a block diagram of an example biosensor system 100 in accordance with the disclosure. As shown in FIG. 1, the example biosensor system 100 may include, among other things, a sensor array 102, a fluid delivery system 104, a readout circuit 106 and a controller 108. In some embodiments, the readout circuit 106 may include a logarithmic current-to-time converter 107. In some embodiments, the logarithmic current-to-time converter 107 may be located outside of and connected to the readout circuit 106.

The sensor array 102 may have at least one sensing element for detecting a biological or chemical analyte. The sensor array 102 may include an array of bioFETs (e.g., a bioFET 103 shown in FIG. 1), where one or more of the bioFETs in the array are functionalized to detect a particular target analyte. Different ones of the sensors may be functionalized using different capture reagents for detecting different target analytes. The bioFETs may be arranged in a plurality of rows and columns, forming a 2-dimensional array of sensors. In some embodiments, each row of bioFETs is functionalized using a different capture reagent. In some embodiments, each column of bioFETs is functionalized using a different capture reagent. Further details regarding an example design of the example bioFET 103 are provided below.

The fluid delivery system 104 may deliver one or more fluid samples to the sensor array 102. The fluid delivery system 104 may be a microfluidic well positioned above the sensor array 102 to contain a fluid over the sensor array 102. The fluid delivery system 104 may also include microfluidic channels for delivering various fluids to the sensor array 102. The fluid delivery system 104 may include any number of valves, pumps, chambers, channels designed to deliver fluid to the sensor array 102.

The readout circuit 106 is provided to measure signals from the sensors in the sensor array 102 and to generate a quantifiable sensor signal indicative of the amount of a certain analyte that is present in a target solution, according to some embodiments. Details of the readout circuit 106 and the logarithmic current-to-time converter 107 will be discussed below.

The controller 108 may send and receive electrical signals to both the sensor array 102 and the readout circuit 106 to perform bio- or chemical-sensing measurements. The controller 108 may also send electrical signals to the fluid delivery system 104 to, for example, actuate one or more valves, pumps, or motors. The controller 108 may include one or more processing devices, such as a microprocessor, and may be programmable to control the operation of the readout circuit 106, the sensor array 102 and/or the fluid delivery system 104. Examples of various electrical signals that may be sent and received from sensor array 102 will be discussed in more detail below.

Figure 2:
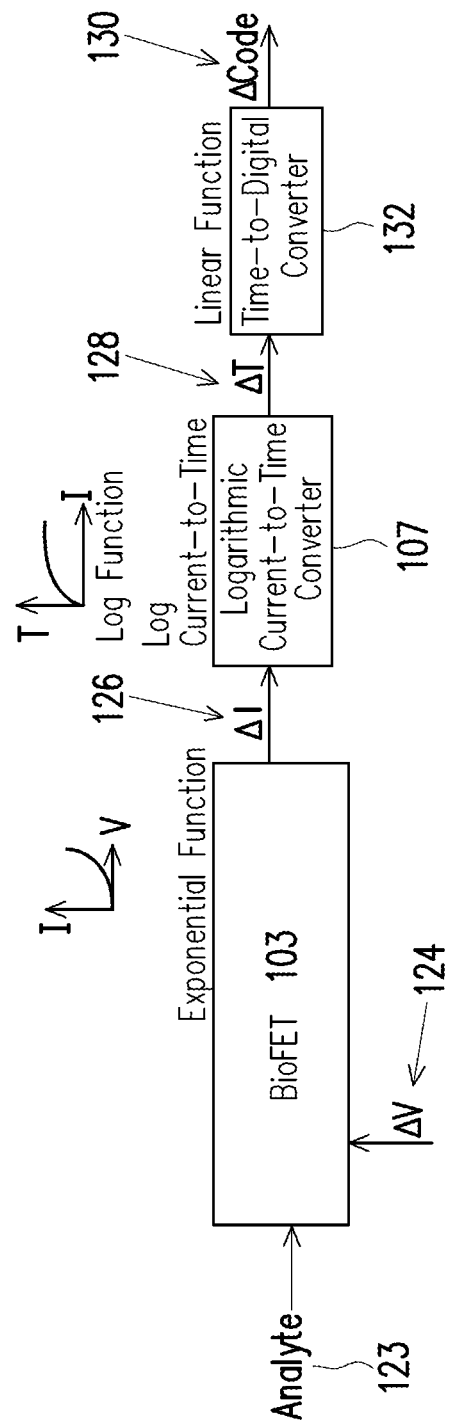
FIG. 2 is a block diagram of an example biosensor system in accordance with some embodiments.

The example bioFET 103 may include, among other things, a fluid gate 112, a source region 114, a drain region 116, a sensing film 118, a channel region 120. The fluid delivery system 104 applies a fluid 122 over the sensing film 118. The fluid 122 may contain analyte (e.g., an analyte 123 as shown in FIG. 2 below). The sensing film 118 may be an electrically and chemically insulating layer that separates the fluid 122 from the channel region 120. The sensing film 118 may include, among other things, a layer of a capture reagent. The capture reagent is specific to an analyte and capable of binding the target analyte or target reagent. Upon binding of the analyte, changes in the electrostatic potential at the surface of the sensing film 118 occur, which in turn results in an electrostatic gating effect of the bioFET 103, and a measurable change in a current between the source and drain electrodes (e.g., an Ids current 126). A voltage applied to the fluid gate 112 may also change the Ids 126. In other words, the output signal of the bioFET 103 is the Ids 126 which has an exponential relationship with the voltage applied to the fluid gate 112. In one embodiment, the bioFET may be a dual-gate back-side FET sensor, though other types of bioFETs are within the scope of the disclosure.

FIG. 2 is a block diagram of an example biosensor system in accordance with the disclosure. As shown in FIG. 2, the example biosensor system 100 may include, among other things, the analyte 123, the bioFET 103, the logarithmic current-to-time converter 107 and a time-to-digital converter 132. As discussed above, after the analyte is bound on the sensing film 118 of the bioFET 103, a measurable change in the Ids 126 occurs. A change in the voltage applied to the fluid gate 112 (i.e., a $\Delta V$ 124) may trigger a change in the Ids 126 (i.e., a $\Delta I$ 126). The relationship between the Ids 126 and the voltage applied to the fluid gate 112 is an exponential function in the illustrated example. The output of the bioFET 103 (i.e., the $\Delta I$ 126) is fed to the logarithmic current-to-time converter 107.

The logarithmic current-to-time converter 107 may convert the $\Delta I$ 126 to a linear time domain signal $\Delta T$ 128. Specifically, the $\Delta T$ 128 has a logarithmic relationship with the $\Delta I$ 126, whereas the $\Delta I$ 126 has an exponential relationship with the $\Delta V$ 124. As a result, the $\Delta T$ 128 has a linear relationship with the $\Delta V$ 124 and is output as a pulse-width signal. Details of the logarithmic current-to-time converter 107 will be discussed below.

The $\Delta T$ 128 is further fed to the time-to-digital converter 132. The time-to-digital converter 132 may digitalize the $\Delta T$ 128 and output a digital count (i.e., a $\Delta$Code 130) corresponding to a width of the $\Delta T$ 128 which is a pulse-width signal. As such, the $\Delta T$ 128 has no input dynamic range limitation. Moreover, the biosensor system in accordance with disclosed examples does not require an analog-to-digital converter. Example circuit implementations thus may result in low cost, low power consumption and quick development time.

Figure 3A:
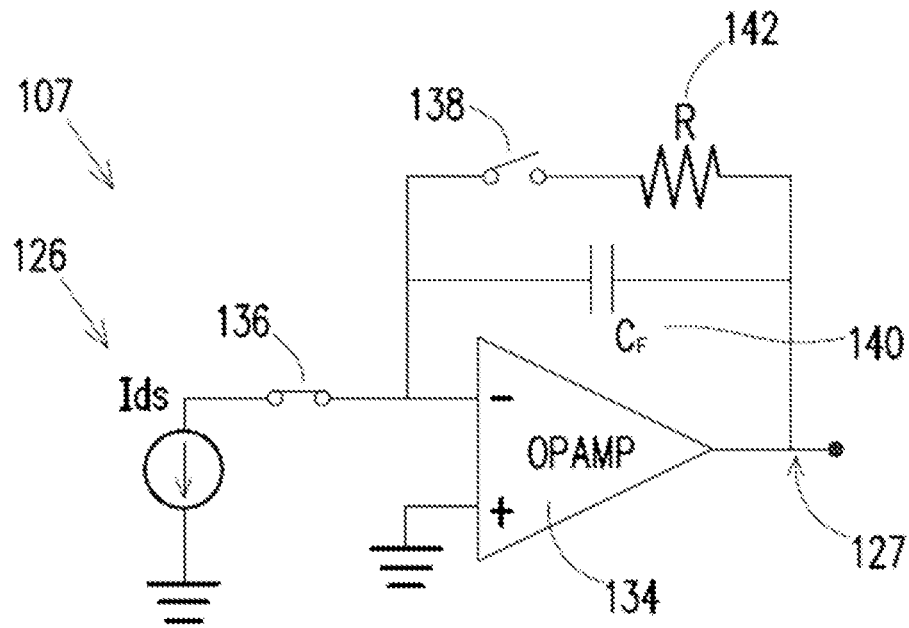
FIG. 3A is a diagram illustrating a circuit of an example logarithmic current-to-time converter in accordance with some embodiments.
Figure 3B:
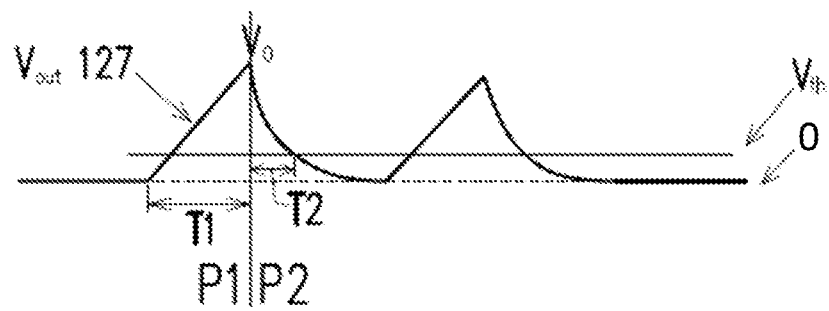
FIG. 3B is a time diagram of the circuit of the example logarithmic current-to-time converter of FIG. 3A in accordance with some embodiments.

FIG. 3A is a diagram illustrating a circuit of an example logarithmic current-to-time converter in accordance with aspects of the disclosure. FIG. 3B is a time diagram of the circuit of the example logarithmic current-to-time converter of FIG. 3A. As shown in FIG. 3A, the circuit of the example logarithmic current-to-time converter may include, among other things, an operational amplifier 134, a first switch 136, a second switch 138, a capacitor 140, a resistor 142 and the Ids 126.

The operational amplifier 134 has two inputs: a positive or non-inverting input and a negative or inverting input. The operational amplifier 134 also has one output. The non-inverting input is connected to ground, whereas the inverting input is connected to the Ids 126 through the first switch 136. The Ids 126 is the output of the bioFET 103 and is connected between the first switch 136 and ground. The capacitor 140 is connected between the inverting input and the output of the operational amplifier 134. The second switch 138 is connected in series with the resistor 142, and the second switch 138 and the resistor 142 together are connected in parallel with the capacitor 140. In other words, the second switch 138 and the resistor 142 together are connected between the inverting input and the output of the operational amplifier 134.

Referring to FIG. 3B, the circuit has two different phases: a charging phase P1 and a discharging phase P2. During the charging phase P1, the first switch 136 is on while the second switch 138 is off. As a result, the Ids 126 begins to charge the capacitor 140. An output 127 (i.e., the $V_{out}$ 127) begins to rise in a linear manner from zero and ends up with a voltage $V_0$ at the end of P1. The period of P1 is T1. Therefore, $V_0$ can be calculated according to the equation below, $$V_0 = \frac{Ids * T1}{C_F},$$

where $C_F$ is the capacitance of the capacitor 140. During the discharging phase P2, the second switch 138 is on while the first switch 136 is off. As a result, the Ids 126 is cut off and the capacitor 140 begins to discharge through the resistor 142 and second switch 138. The $V_{out}$ 127 is an exponential signal. Specifically, the $V_{out}$ 127 can be calculated according to the equation below, $$V_{out} = V_0 e^{-\frac{t}{RC_F}},$$

where R is the resistance of the resistor 142. At a time T2 from the beginning of the discharging phase P2, the $V_{out}$ 127 drops down to reach a reference voltage $V_{th}$. Thus, $V_{th}$ can be calculated according to the equation below, $$V_{th} = V_0 e^{-\frac{T2}{RC_F}} = \frac{Ids * T1}{C_F} * e^{-\frac{T2}{RC_F}}.$$

Put in another way, T2 can be calculated according to the equation below, $$T2 = R * C_F * \ln\left(\frac{Ids * T1}{V_{th} * C_F}\right).$$

In other words, T2 is proportionate to a logarithmic function of the Ids 126. As such, the logarithmic current-to-time converter 107 may realize the logarithmic function and convert the Ids 126 into the time domain signal 128. Moreover, since the Ids 126 is in an exponential relationship with the voltage applied to the fluid gate 112, T2 is in a linear relationship with the voltage applied to the fluid gate 112.

If the first switch 136 and the second switch 138 keep this pattern of the charging phase P1 and the discharging phase P2 periodically (i.e. clocked), the $V_{out}$ 127 is also in a periodic pattern as shown in FIG. 3B.

Figure 4A:
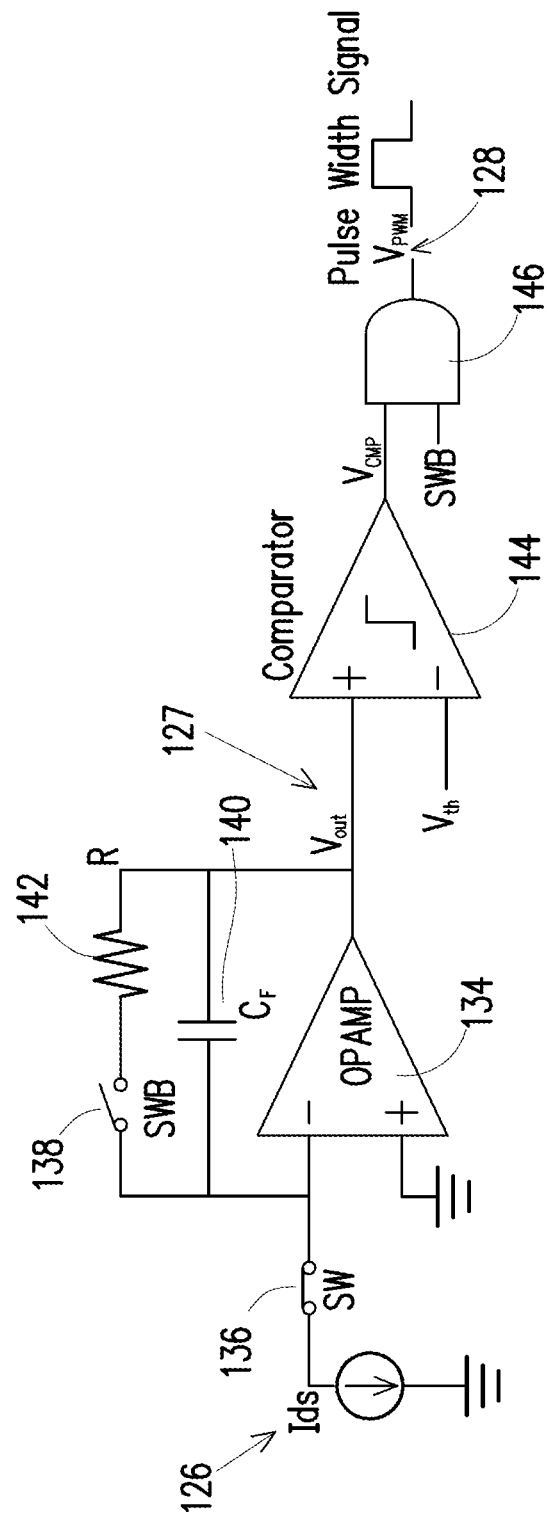
FIG. 4A is a diagram illustrating a circuit of an example logarithmic current-to-time converter in accordance with some embodiments.
Figure 4B:
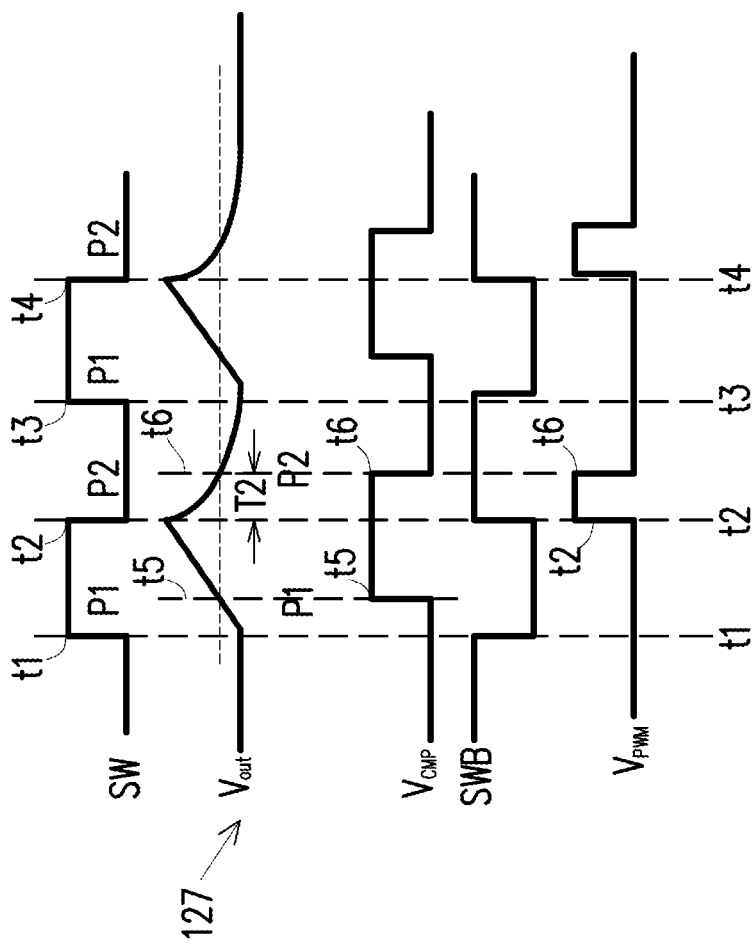
FIG. 4B is a time diagram of the circuit of the example logarithmic current-to-time converter of FIG. 4A in accordance with some embodiments.

FIG. 4A is a diagram illustrating a circuit of an example logarithmic current-to-time converter in accordance with aspects of the disclosure. FIG. 4B is a time diagram of the circuit of the example logarithmic current-to-time converter of FIG. 4A. As shown in FIG. 4A, the circuit of the example logarithmic current-to-time converter may include, among other things, the operational amplifier 134, the first switch 136, the second switch 138, the capacitor 140, the resistor 142 and the Ids 126, which have been discussed with reference to FIG. 3A and FIG. 3B. The circuit of the example logarithmic current-to-time converter may further include, among other things, a comparator 144 and an AND gate 146.

The comparator 144 has two inputs: a non-inverting input and an inverting input. The comparator 144 also has one output. The non-inverting input is connected to the output of the operational amplifier 134. The inverting input is fed by the $V_{th}$. The output of the comparator (i.e., the $V_{CMP}$) is input to the AND gate 146 along with a switch signal bar (i.e., the SWB) which is the complement of a clock, or switch signal (i.e., the SW). The output of the AND gate 146 is a pulse width signal (i.e., the $V_{PWM}$ 128) which will be discussed with reference to FIG. 4B.

Referring to FIG. 4B, during the charging phase P1 (e.g., from t1 to t2; from t3 to t4) when the SW is at logical high (i.e., 1), and the first switch 136 is on while the second switch 138 is off. As a result, the Ids 126 begins to charge the capacitor 140. The $V_{out}$ 127 begins to rise at t1 in a linear manner from zero and ends up at t2 with the voltage $V_0$. Specifically, at t5 the $V_{out}$ 127 rises to the $V_{th}$.

During the discharging phase P2 (e.g., from t2 to t3), the SW is at logical low (i.e., 0), and the second switch 138 is on while the first switch 136 is off. As a result, the Ids 126 is cut off and the capacitor 140 begins to discharge to the resistor 142. The $V_{out}$ 127 falls exponentially from t2 to t3. Specifically, at t6 which is a time period T2 following the time t2, the $V_{out}$ 127 drops down to reach the $V_{th}$. As discussed above, the time period T2 (i.e., the period from t2 to t6) can be calculated according to the equation below, $$T2 = R * C_F * \ln\left(\frac{Ids * T1}{V_{th} * C_F}\right).$$

From t5 to t6, the $V_{out}$ 127 is above the $V_{th}$. Therefore, the $V_{CMP}$ is logical high because the comparator 146 compares the $V_{out}$ 127 and the $V_{th}$. The SWB is at logical low from t1 to t2 and at logical high from t2 to t3. As a result, the $V_{PWM}$ 128 is at logical high from t2 to t6 because both the $V_{CMP}$ and the SWB are at logical high from t2 to t6. As mentioned above, T2 is the period from t2 to t6. Thus, the pulse width signal (i.e., the $V_{PMW}$ 128) has a pulse width that is equal to T2. In other words, the pulse width of the $V_{PWM}$ 128 is in a linear relationship with the voltage applied to the fluid gate 112.

Figure 5:
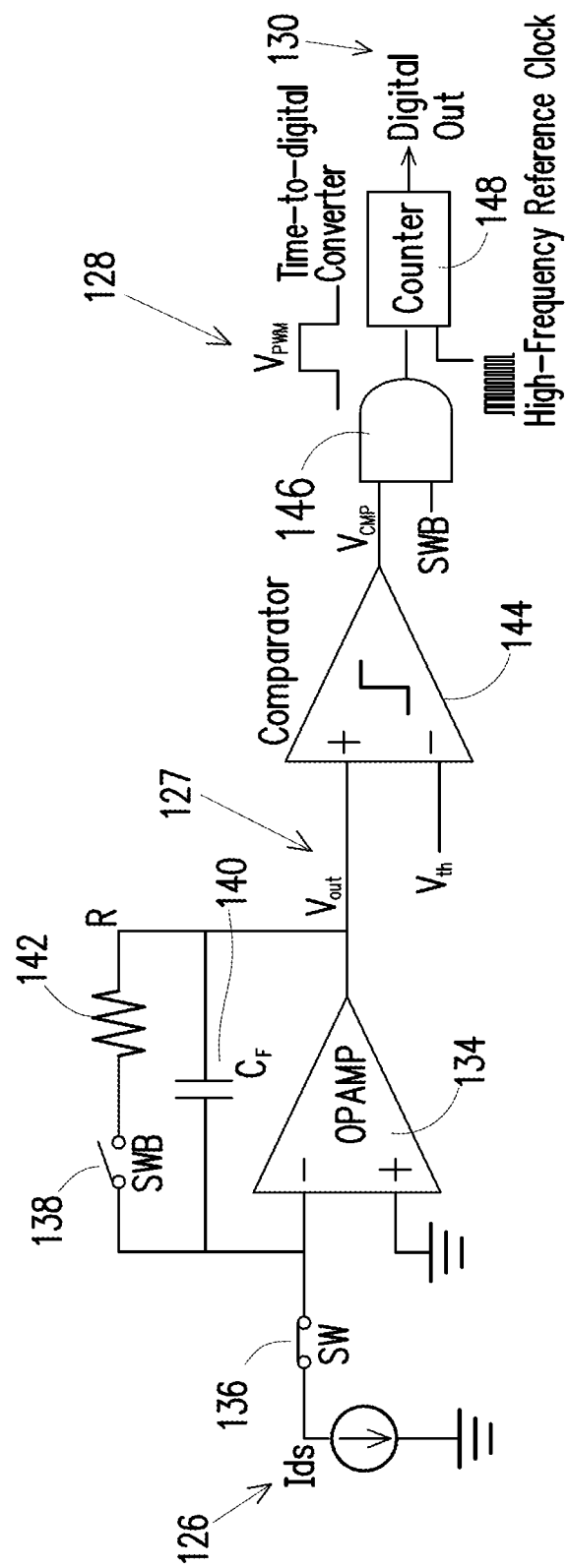
FIG. 5 is a diagram illustrating an example readout circuit with an example logarithmic current-to-time converter in accordance with some embodiments.

FIG. 5 is a diagram illustrating an example readout circuit with an example logarithmic current-to-time converter in accordance with the disclosure. As shown in FIG. 5, the example readout circuit may include, among other things, the operational amplifier 134, the first switch 136, the second switch 138, the capacitor 140, the resistor 142, the Ids 126, the comparator 144, the AND gate 146 which have been discussed with reference to FIGS. 3A-3B and 4A-4B. The example readout circuit may further include, among other things, a time-to-digital converter. In the embodiment shown in FIG. 5, the time-to-digital converter is a counter 148.

The example counter 148 may receive the $V_{PWM}$ 128 and a high-frequency reference clock. The example counter 148 may output a digital output 130 corresponding to the pulse width of the $V_{PWM}$ 128 by counting the duration of the $V_{PWM}$ based on the pulses from the high-frequency reference clock.

Figure 6:
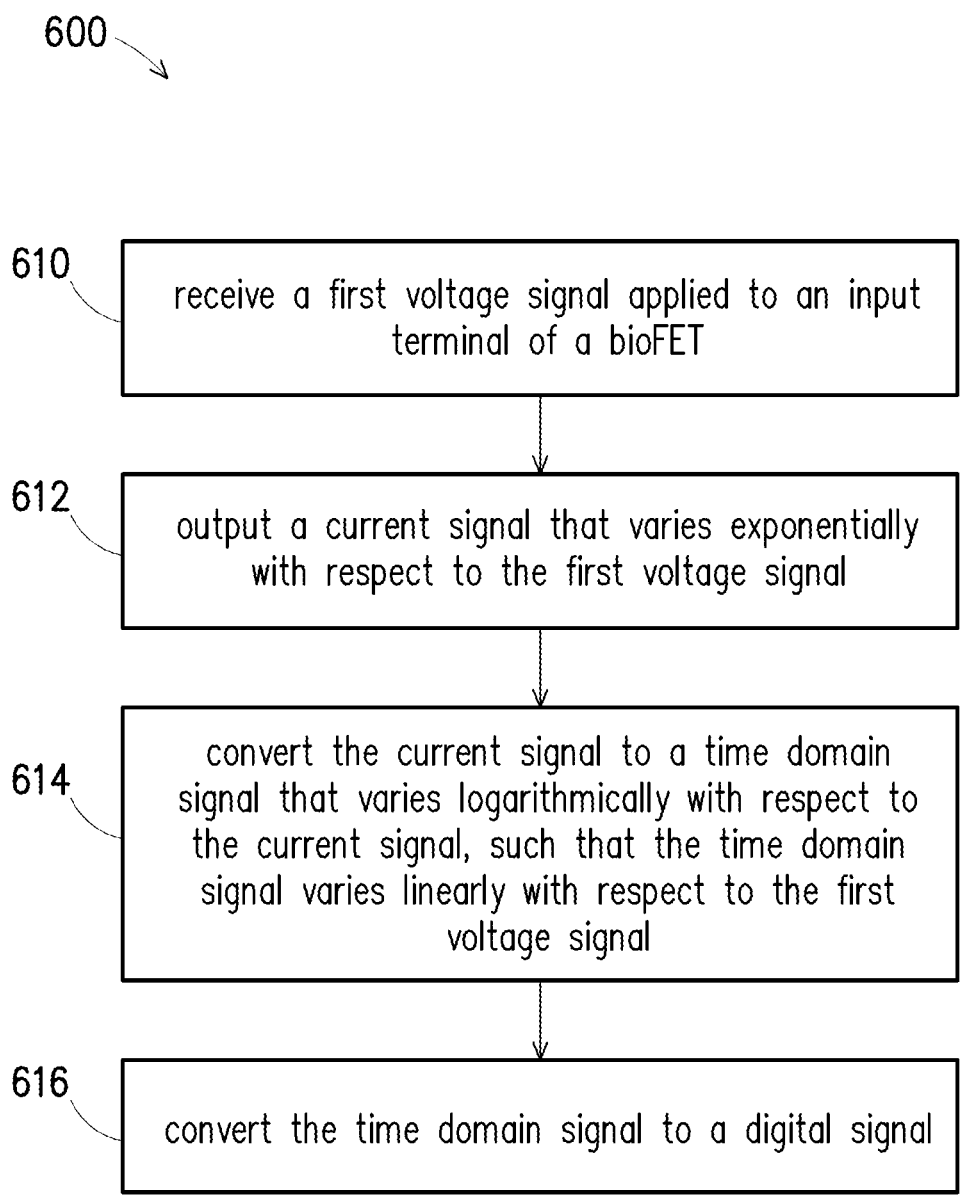
FIG. 6 is a flow chat of an example method for operating an biosensor system in accordance with some embodiments.

FIG. 6 is a flow chart of an example method for operating a biosensor system in accordance with some embodiments. At step 610, a first voltage signal 124 applied to an input terminal of a bioFET 103 is received. A current signal Ids is output at step 612 that varies exponentially with respect to the first voltage signal. At step 614, the current signal Ids is converted to a time domain signal $V_{PWM}$ that varies logarithmically with respect to the current signal, such that the time domain signal varies linearly with respect to the first voltage signal. The time domain signal is converted to a digital signal 130 at step 616.

Embodiments in accordance with the disclosure thus include a bioFET system that includes a bioFET configured to receive to a first voltage signal and output a current signal. A logarithmic current-to-time converter connected to the bioFET and is configured to receive the current signal and convert the current signal to a time domain signal. The time domain signal varies logarithmically with respect to the current signal. As such, the time domain signal varies linearly with respect to the first voltage signal.

Further embodiments include a method for operating a bioFET system where a first voltage signal applied to an input terminal of a bioFET is received, and a current signal that varies exponentially with respect to the first voltage signal is output. The current signal is converted to a time domain signal that varies logarithmically with respect to the current signal, such that the time domain signal varies linearly with respect to the first voltage signal. The time domain signal is converted to a first digital signal.

Further embodiments include a bioFET system that includes a sensor array having a plurality of bioFETs, where each bioFET is configured to output a first current signal in response to a first voltage signal applied to an input terminal of the bioFET. A fluid delivery system is configured to deliver a fluid sample containing an analyte to the plurality of bioFETs. A logarithmic conversion circuit is connected to the sensor array and is configured to convert each of the current signals to respective second voltage signals, each varying linearly with respect to the respective current signals during a charging phase, and varying exponentially during a discharging phase. A pulse width signal generator circuit is configured to convert each of the second voltage signals to respective time domain signals based on a discharge time of the second voltage signal during the discharge phase.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A bio-field effect transistor (bioFET) system comprising:
    a bioFET configured to receive a first voltage signal and output a current signal; and
    a current-to-time converter configured to receive the current signal and convert the current signal to a time domain signal, wherein the current-to-time converter comprises:

a conversion circuit having an input terminal to selectively receive the current signal and configured to output a second voltage signal based on the current signal, wherein the second voltage signal increases during a charging phase and decreases during a discharging phase; and a circuit configured to receive the second voltage signal and a reference voltage and provide an output signal based on the second voltage signal and the reference voltage and further configured to output the time domain signal based on a switch signal that is used to enter the discharging phase and the output signal.

2. The system of claim 1, wherein the circuit includes a comparator connected to receive the second voltage signal and the reference voltage and output a compare signal based on the second voltage signal and the reference voltage.

3. The system of claim 2, wherein the circuit includes an AND gate connected to receive the compare signal and the switch signal that is used to enter the discharging phase, the AND gate configured to output the time domain signal as a first pulse width signal having a pulse width based on the switch signal and the compare signal.

4. The system of claim 1, comprising a time-to-digital converter connected to the current-to-time converter and configured to receive the time domain signal and convert the time domain signal to a digital signal.

5. The system of claim 4, wherein the time-to-digital converter includes a counter connected to receive the time domain signal and a reference clock signal, and output the digital signal based on a pulse width of the time domain signal and the reference clock signal, wherein the reference clock signal has a frequency higher than a frequency of the time domain signal.

6. The system of claim 1, wherein the conversion circuit is configured to connect the current signal to a capacitor for a predetermined time corresponding to the charging phase to provide the second voltage signal.

7. The system of claim 6, wherein the conversion circuit is configured to disconnect the current signal from the capacitor and discharge the capacitor through a resistor during the discharging phase.

8. The system of claim 1, wherein the conversion circuit includes:

an operational amplifier having an inverting input terminal, a non-inverting input terminal, and an output terminal, wherein the non-inverting input terminal is connected to a reference terminal;

a first switch connected between the inverting input terminal and the current signal, the first switch being responsive to the switch signal to selectively connect the current signal to the inverting input terminal during the charging phase;

an RC circuit including a resistor and a capacitor connected in parallel between the inverting input terminal and the output terminal of the operational amplifier; and a second switch connected in series between the inverting input terminal and the resistor, the second switch being responsive to the switch signal to selectively connect the output terminal to the inverting input terminal through the RC circuit during the discharging phase.

9. The system of claim 1, comprising:

a fluid delivery system configured to deliver a fluid sample containing an analyte to the bioFET.

10. The system of claim 9, comprising:

a controller connected to the fluid delivery system, the bioFET, and the current-to-time converter, and configured to control operations of the fluid delivery system, the bioFET, and the current-to-time converter.

11. A bio-field effect transistor (bioFET) system comprising:

a sensor array having a plurality of bioFETs, each bioFET configured to output a current signal in response to a first voltage signal;

a conversion circuit connected to the sensor array and configured to convert the current signal to a second voltage signal that increases during a charging phase and decreases during a discharging phase; and a pulse width signal generator circuit configured to convert the second voltage signal to a time domain signal having a pulse width determined by a discharge time of the second voltage signal during the discharge phase.

12. The system of claim 11, comprising a time-to-digital converter that provides a count value for the discharge time of the second voltage signal during the discharge phase.

13. The system of claim 12, wherein the time-to-digital converter includes a counter configured to receive the time domain signal having the pulse width determined by the discharge time of the second voltage signal during the discharge phase and a reference clock signal, and to output a digital signal corresponding to the pulse width of the time domain signal determined by the discharge time of the second voltage signal during the discharge phase.

14. The system of claim 11, wherein the conversion circuit includes:

an operational amplifier having an inverting input terminal, a non-inverting input terminal, and an output terminal, the non-inverting input terminal connected to a reference terminal;

a first switch connected between the inverting input terminal and the current signal;

a capacitor connected between the output terminal and the non-inverting input terminal, wherein the first switch is responsive to a switching signal to selectively connect the capacitor to the current signal to charge the capacitor during the charging phase;

a second switch connected to the inverting input terminal; and a resistor connected between the second switch and the output terminal;

wherein the capacitor is connected in parallel with the second switch and the resistor, and the second switch is responsive to the switching signal to selectively discharge the capacitor through the resistor during the discharge phase.

15. The system of claim 14, wherein the pulse width signal generator circuit includes:

a comparator having a non-inverting input terminal connected to the output terminal and an inverting input terminal connected to receive a reference voltage, and configured to output a comparison signal; and an AND gate having a first input terminal connected to receive the comparison signal, a second input terminal connected to receive the switching signal, and an output terminal configured to output the time domain signal.

16. A method for operating a bio-field effect transistor (bioFET) system, comprising:

outputting a current signal from the bioFET in response to a first voltage signal;

receiving the current signal from the bioFET at a current-to-time converter circuit configured to receive the current signal and convert the current signal to a time domain signal;

outputting a second voltage signal based on the current signal, wherein the second voltage signal increases during a charging phase and decreases during a discharging phase;

providing an output signal based on the second voltage signal and a reference signal; and outputting the time domain signal based on the output signal and a switch signal that is used to enter the discharging phase.

17. The method of claim 16, wherein providing the output signal includes comparing the second voltage signal to a reference signal and providing a comparison output of the comparison of the second voltage signal and the reference signal.

18. The method of claim 16, wherein outputting the time domain signal includes receiving the output signal at one input of an AND gate and receiving a first switch signal that is used to enter the discharging phase at another input of the AND gate to provide the time domain signal.

19. The method of claim 18, wherein outputting the time domain signal includes providing a pulse width signal having a pulse width based on the output signal and the first switch signal.

20. The method of claim 16, comprising:

receiving the time domain signal at a counter; and receiving a high-frequency reference clock signal at the counter to provide a digital signal that corresponds to a pulse width of the time domain signal.

\* \* \* \* \*